United States Patent [19]
Miwa

[11] Patent Number: 5,978,252
[45] Date of Patent: Nov. 2, 1999

[54] FERROELECTRIC MEMORY DEVICE HAVING FATIGUE AVERAGING

[75] Inventor: Tohru Miwa, Tokyo, Japan

[73] Assignee: NEC Corporation, Tokyo, Japan

[21] Appl. No.: 09/102,353

[22] Filed: Jun. 23, 1998

[30] Foreign Application Priority Data

Jun. 23, 1997 [JP] Japan ................................. 9-166103

[51] Int. Cl.$^6$ .................................................. G11C 11/22
[52] U.S. Cl. ........................................... 365/145; 365/149
[58] Field of Search .................................... 365/145, 149, 365/210, 203

[56] References Cited

U.S. PATENT DOCUMENTS

| | | | |
|---|---|---|---|
| 4,873,664 | 10/1989 | Eaton, Jr. ............................... | 365/145 |
| 5,218,566 | 6/1993 | Papaliolios ............................. | 365/145 |
| 5,237,533 | 8/1993 | Papaliolios ............................. | 365/145 |
| 5,487,032 | 1/1996 | Mihara et al. ......................... | 365/145 |
| 5,745,403 | 4/1998 | Taylor .................................... | 365/145 |

FOREIGN PATENT DOCUMENTS 63-201998  8/1988  Japan .

*Primary Examiner*—Son Mai
*Attorney, Agent, or Firm*—Sughrue, Mion, Zinn, Macpeak & Seas, PLLC

[57] ABSTRACT

A nonvolatile semiconductor memory device using a ferroelectric memory includes memory cells having two ferroelectric capacitors and two MOS transistors. The memory device includes a switching circuit that reverses the polarity, or sign, of data when previously-read data is written back into the memory cell. A toggle bit memory stores a toggle bit representing the sign of the data that was switched by the switching circuit. The semiconductor memory device has a resetting circuit that returns the reversed-sign data to its normal state using the switching circuit, based on the data read from the memory cell and the toggle bit read from the toggle bit memory.

12 Claims, 10 Drawing Sheets

FIG.11
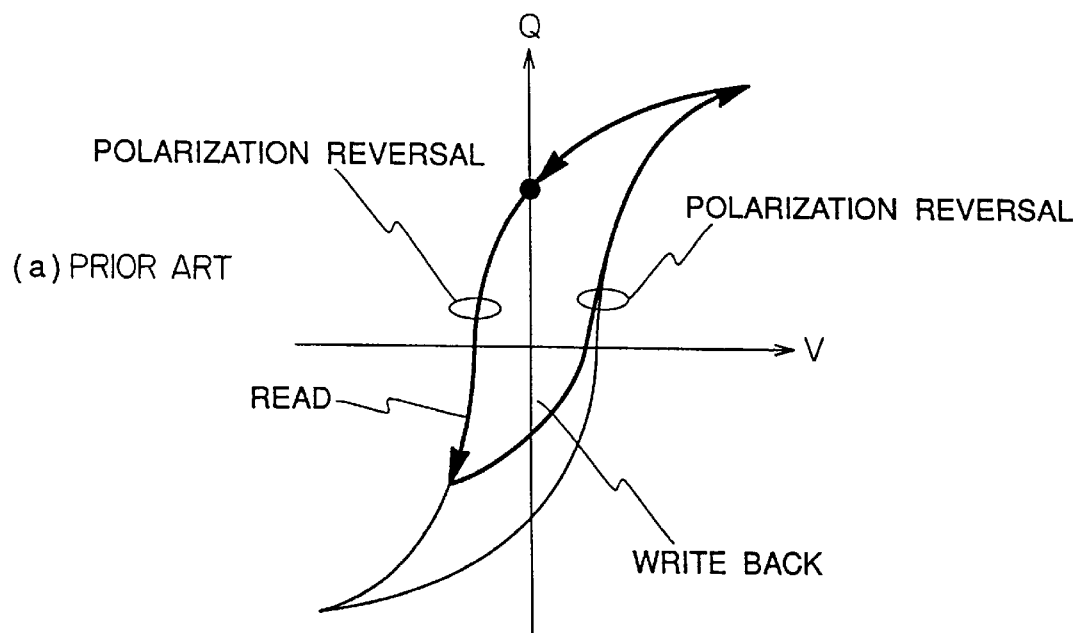
(a) PRIOR ART
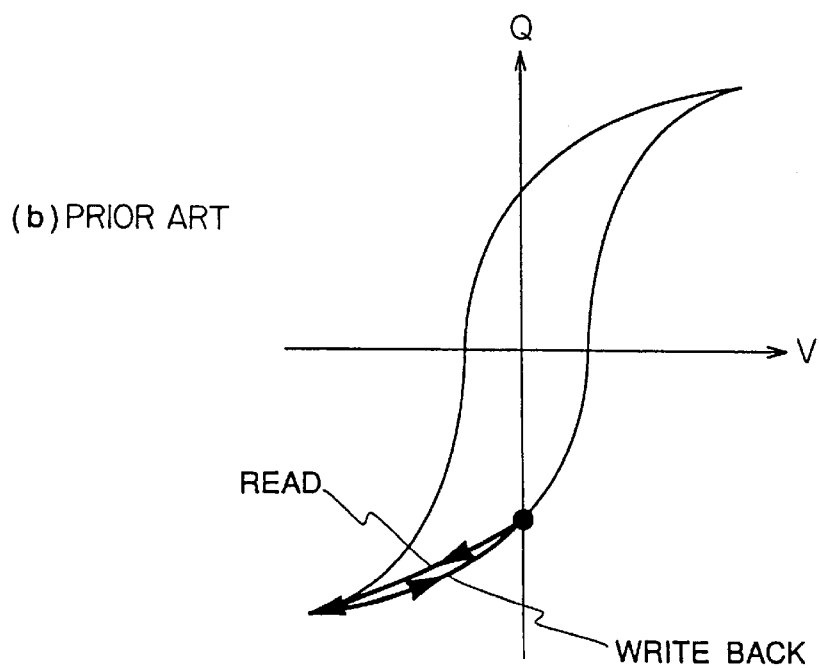
(b) PRIOR ART

FERROELECTRIC MEMORY DEVICE HAVING FATIGUE AVERAGING

BACKGROUND OF THE INVENTION

1. Field of the Invention

The present invention relates to a nonvolatile semiconductor memory device that uses a thin ferroelectric film and more particularly to a 2T/2C type ferroelectric memory wherein one memory cell comprises two ferroelectric capacitors and two MOS transistors.

2. Description of the Related Art

Nonvolatile ferroelectric random access memories (FeRAM) which use ferroelectric materials carry out nonvolatile storage in the direction of the remnant polarization of ferroelectric capacitors. For a 2T/2C type ferroelectric memory, one memory cell comprises two ferroelectric capacitors and two MOS transistors. This memory stores information of 1 bit by means of polarizing the two ferroelectric capacitors in directions opposite to each other.

For example, FIG. 7 shows the composition of a 2T/2C type ferroelectric memory disclosed in U.S. Pat. No. 4,873,664 and Japanese Laid Open Patent Publication A-63-201998.

This conventional ferroelectric memory has bit line pairs comprising positive bit lines $2_1, 2_2, \ldots$ and negative bit lines $3_1, 3_2, \ldots$, memory cells (MC) 10 arranged in an array shape at the intersection between word lines $1_1$ to $1_n$, pre-charge circuits 9 one being disposed at each bit line pair, sense amps 8 one being disposed at each bit line pair, a Y-switch circuit 7 that selectively connects the bit line pairs and data line pairs $16_1, 16_2, \ldots$, data amps (DA) $13_1, 13_2, \ldots$ equal in number to the data line pairs $16_1, 16_2, \ldots$, and write buffers (WB) $14_1, 14_2, \ldots$ equal in number to the data line pairs $16_1, 16_2, \ldots$ The memory cells 10 are arranged on the same word lines 11 to $1_n$. The memory cells 10 which are arranged on the same word lines $1_1$ to $1_n$ comprise one word that forms a read and write access unit of storage data.

The latch type sense amp 8 amplifies a minute potential difference between two lines of respective pairs and the line exhibiting a lower potential is set to 0V and the line exhibiting a higher potential, to VCC. Therefore, the sense amp activation signal 12 changes to the power supply voltage (VCC) from 0V.

Bit line pairs that comprise one word are selectively connected to the data line pairs such as $16_1, 16_2, \ldots$ through the Y-switch circuit 7. This data line pair $16_1, 16_2$ includes two data lines, positive and negative, which correspond to the bits which comprise the word on a one-to-one basis.

The Y-switch circuit 7 connects the designated bit line pair and data line pair only during the period when a Y-switch activation signal 19 is at the VCC level. On each of data line pairs are connected a complementary input of data amps $13_1, 13_2, \ldots$ and a complementary output of write buffers $14_1, 14_2, \ldots$ The data amps $13_1, 13_2, \ldots$ amplify each data appearing on the data line pairs and then externally output the data as output data $28_1, 28_2, \ldots$ The write buffers $14_1, 14_2, \ldots$ output input data $29_1, 29_2, \ldots$ supplied from an external source to the data line pairs $16_1, 16_2, \ldots$ during the period when a write activation signal 17 is VCC. In particular, when the Y-switch circuit 7 is active and the sense amps 8 are active, the data that was output to the data line pairs $16_1, 16_2, \ldots$ is output to the sense amps 8 which are connected through the Y-switch circuit 7.

Referring to FIG. 8, the memory cell 10 is comprised by two ferroelectric capacitors 22, 23 and two N-channel MOS transistors 20, 21.

Hereafter, the memory cell 10 disposed at the intersection of the word line 11 and the bit line pair that comprises and the positive bit line $2_1$ the negative bit line $3_1$ will be described.

One electrode of the ferroelectric capacitors 22, 23 is connected to the positive bit line 21 or the negative bit line $3_1$ through N-channel MOS transistor 20, 21. The other electrode is connected to a plate line 4. Further, the gates of the two transistors 20, 21 are connected to the word line $1_1$.

Referring to FIG. 9, a pre-charge circuit 9 comprises N-channel MOS transistors 24, 25. Because this circuit 9 pre-charges the bit line pair to 0V, while the read and write of the data is not carried out in standby, a bit line pre-charge signal 11 is VCC.

Next, the read operation of this conventional ferroelectric memory will be described. At first, the bit line pre-charge signal 11 falls from VCC to 0V then the bit line pair floats at 0V. Next, the word line 11 is at VCC. Then, when the plate line 4 rises from 0V to VCC, a voltage is applied to the ferroelectric capacitors 22, 23 of all the memory cells 10 selected on the word line. This voltage reverses the polarization of one of the ferroelectric capacitors and then by means of supplying a large amount of charge from the ferroelectric capacitors, the voltage of the connected bit lines becomes higher. Thus, because the other ferroelectric capacitor does not reverse its polarization, the voltage of the connected bit lines becomes lower in comparison to the bit line of the opposite side.

Hereafter, in order to simplify the description, the positive bit line (negative bit line) exhibits a higher voltage compared to the negative bit line (positive bit line). In this way, the difference in the voltage that appears on the positive and negative bit lines is amplified by the sense amps 8. By means of this action, the positive bit line (negative bit line) that exhibits a high voltage is VCC and the negative bit line (positive bit line) that exhibits a low voltage is 0V.

Thereafter, the bit line pair $(2_1, 3_1)$ connects to a data line pair $16_1$ through the Y-switch circuit 7 at a timing wherein the Y-switch circuit activation signal 19 is active. Finally, the signal that appears on the data line pair $16_1$ is amplified by data amp $13_1$ and outputs as output data $28_1$. Hereupon, because the positive bit line (negative bit line) is at a high voltage, the output data is "1" ("0").

After the data is read, both of the two ferroelectric capacitors 22, 23 are at a high voltage on the plate line 4 side. Because of this, if the voltage on both side is left as is at 0V, the direction of the remnant polarization lines up. In order to read the same data at the next access, it is necessary to write back the data twice. In this conventional ferroelectric memory, the write back is carried out as follows.

At first, with the sense amps 8 in an active state, the plate line 4 falls from VCC to 0V. Next, the sense amps 8 enter an inactive state, the bit line pre-charge signal 11 rises from 0V to VCC and both bit lines are 0V. Lastly, with the word line at 0V, the ferroelectric capacitors 22, 23 separate from the bit line. Before the ferroelectric capacitor that did not reverse its polarization during the read lowers the voltage of the plate line 4, 0V is applied to the bit line side and VCC is applied to the plate line 4 side. When this ferroelectric capacitor lowers the plate line to 0V, both sides become 0V and as shown in FIG. 10, the remnant polarization is maintained at point B in the Q-V plane.

In contrast, when the ferroelectric capacitor that reversed its polarization during the read lowers the voltage of the plate line 4, VCC is applied to the bit line side and 0V is applied to the plate line 4 side. When this ferroelectric capacitor lowers the bit line to 0V, both sides become 0V and as shown in FIG. 10, the remnant polarization is maintained at point A in the Q-V plane. In this ferroelectric memory, the polarization reversal occurs one time due to the write back. By means of this write back operation, reading of the same data is ensured even during a subsequent read.

Regretfully, in this conventional example, an imbalance exists in which the polarization reversal occurs two times in one of the ferroelectric capacitors per each access through the above-mentioned read/write back and in the other ferroelectric capacitor the polarization reversal does not occur. FIG. 11 (a) shows the plot the ferroelectric capacitor follows in the Q-V plane when the polarization reversal occurs two times and FIG. 11(b) shows the plot the ferroelectric capacitor follows in the Q-V plane when the polarization reversal does not occur. In this way, when repeatedly reading data in a conventional 2T/2C type ferroelectric memory, one of the ferroelectric capacitors will repeatedly reverse its polarization. Moreover, a voltage pulse of one direction will be repeatedly applied to the other ferroelectric capacitor.

Next, the write operation of this conventional ferroelectric memory will be described.

Hereafter, a case when writing input data $29_1$ to the memory 10 disposed at the intersection between the word line $1_1$ and the bit line pair that comprises the positive bit line $2_1$ and the negative bit line $3_1$ will be described.

During the write operation in the ferroelectric memory, input data $29_1$ supplied from an external source is written to a random word. Because ferroelectric memory is a destructive read type memory, the storage data of the memory cell 10 that shares the memory cell 10 to be written to and the word line $1_1$ must be protected. Therefore, at first, the storage data of the memory cell 10 on the word line 11 is amplified and latched by the sense amps 8 using a procedure identical to the previously described read operation.

Next, the Y-switch circuit 7 is made active in a state wherein the input data $29_1$ is output to the data line pair $16_1$ by means of the write buffer $14_1$. At this time, the bit line pair $(2_1, 3_1)$ selectively connect to the data line pair $16_1$ by means of the Y-switch circuit 7. This connection latches the input data $29_1$ to the sense amp 8 connected to the bit line pair $(2_1, 3_1)$ without disturbing the data of the other sense amps 8. Thereafter, the plate line 4 falls, a pre-charge of the bit line to 0V occurs, and the word line 11 falls using a procedure identical to the previously described write back.

Generally, it is known that a ferroelectric capacitor reduces the remnant polarization following the number of times the polarization reversal repeats. This phenomenon is called fatigue. In a ferroelectric memory, if the remnant polarization reduces, the signal voltage output to the bit line during a read will also be reduced. Further, if the bit line signal voltage output to the bit line is made to fall below the input offset voltage of the sense amps then the function as a ferroelectric memory will normally be lost.

When repeatedly reading the same data in the above-mentioned conventional ferroelectric memory, there was a problem in which fatigue would appear concentrated in one of the ferroelectric capacitors with this concentration of fatigue determining the lifespan of the entire ferroelectric memory.

SUMMARY OF THE INVENTION

An object of the present invention is to provide a ferroelectric memory that can average the fatigue of the ferroelectric capacitors which form a pair.

Another object of the present invention is to extend the lifespan of the ferroelectric capacitors by means of averaging the fatigue of the ferroelectric capacitors.

A further object of the present invention is to extend the lifespan of the ferroelectric capacitors without lowering the speed of the writes and reads to the memory.

In order to achieve the above-mentioned objects, the present invention reverses polarization by mechanism of making a cross connection signal active and then carrying out a cross connection utilizing a switching circuit after making a direct connection signal active and reading data, executing a write back and then, while data outputs, using a toggle bit in an EXCLUSIVE OR operation and outputting the data.

Therefore, from among the two ferroelectric capacitors which comprise a memory cell, the ferroelectric capacitor with a polarization reversal that occurred during a read does not reverse polarization during a write back and the ferroelectric capacitor whose polarization did not reverse during a read reverses polarization during a write back, thereby making it possible to average the fatigue of the two ferroelectric capacitors and extend the lifespan of a nonvolatile semiconductor memory device.

In concrete terms, the present invention is a nonvolatile ferroelectric memory device having a plurality of memory cells arranged in columns and rows. The memory cells comprise ferroelectric electrodes which maintain a state of "0" or "1" by means of the polarization state along with being connected to the bit lines.

Moreover, the ferroelectric memory device is comprised by a switching circuit that reverses the sign of data when writing back this data that was read from a memory cell to the memory cell, a toggle bit memory that stores a toggle bit that represents the state of the sign switched by means of the switching circuit, and a reswitching circuit that returns the reversed sign to its normal state utilizing the switching circuit based on the data read from the memory cell and the toggle bit read from the toggle bit memory.

These actions make it possible to average the fatigue of the ferroelectric capacitors which form a pair during a read/write back as well as extend the lifespan twice as long compared to a conventional 2T/2C type ferroelectric memory.

BRIEF DESCRIPTION OF THE DRAWINGS

and FIG. 11 (a) shows a plot the ferroelectric capacitor follows in the Q-V plane when polarization reversal occurs two times and FIG. 11 (b) shows a plot the ferroelectric capacitor follows in the Q-V plane when polarization reversal does not occur in a conventional ferroelectric memory.

DESCRIPTION OF THE PREFERRED EMBODIMENTS

Next, embodiments of the present invention will be described in detail with reference to the attached drawings.

(First Embodiment)

Figure 1:
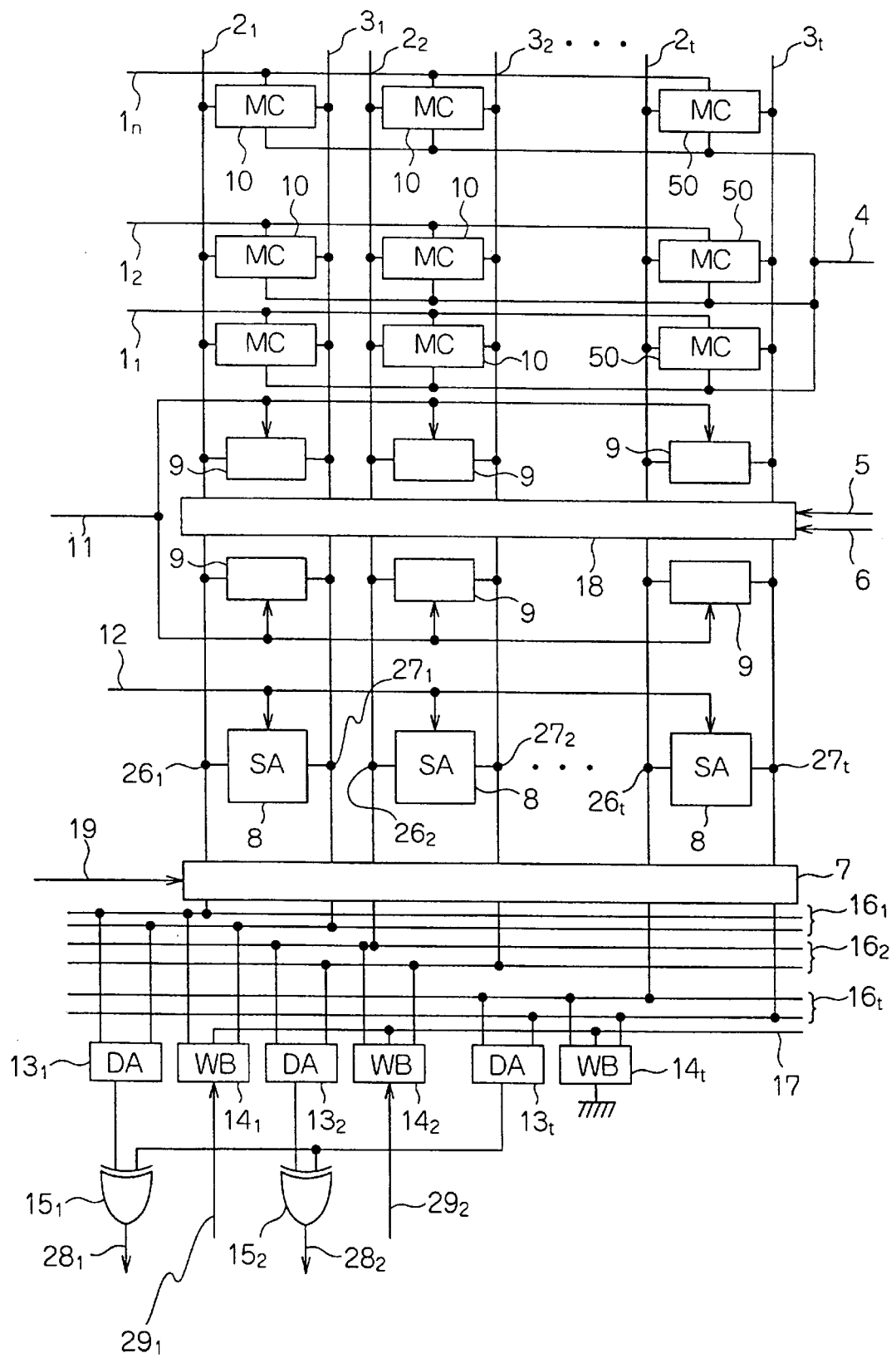
FIG. 1 is a schematic showing the composition of the nonvolatile semiconductor memory device of the first embodiment of the present invention.
Figure 7:
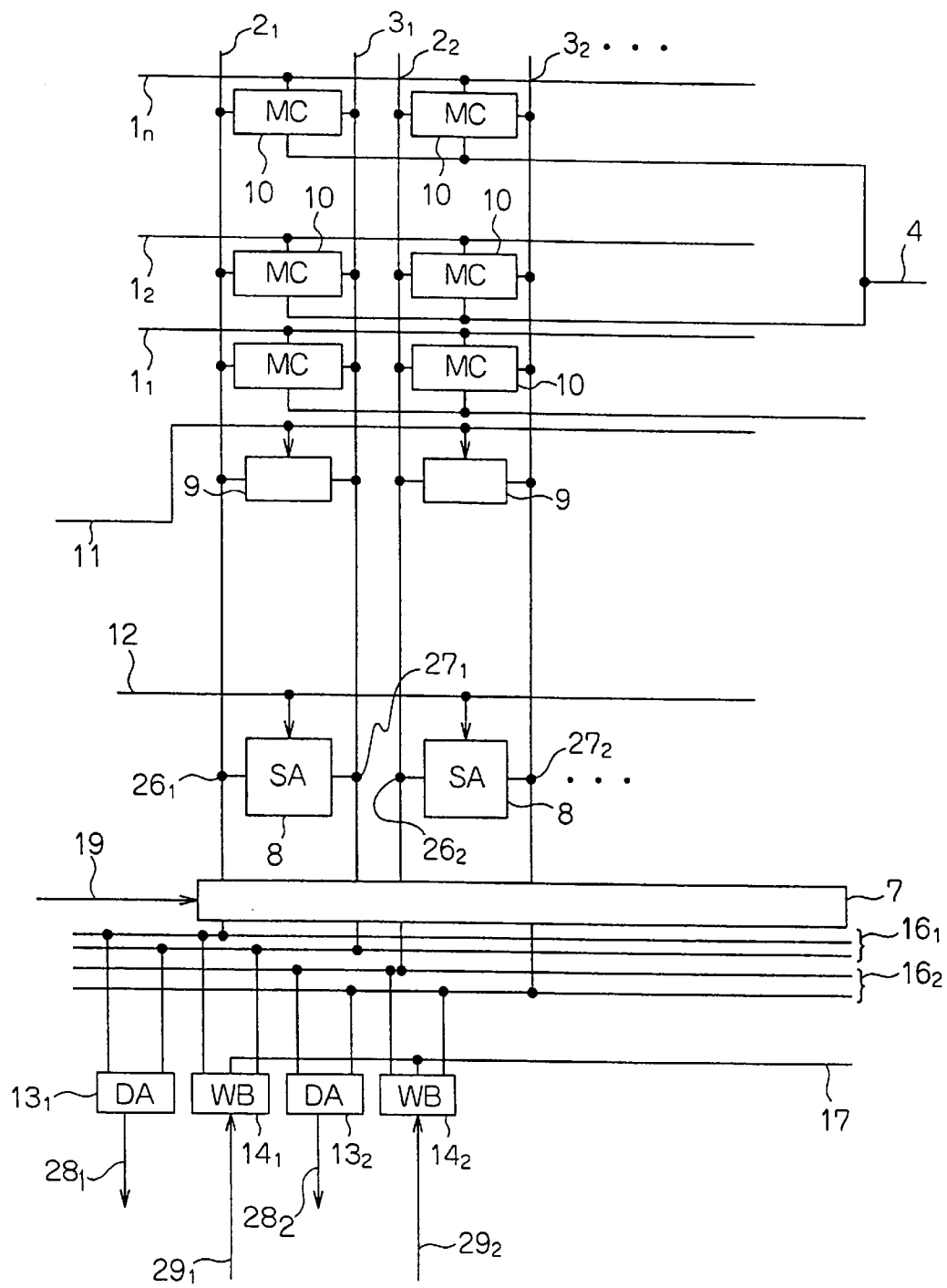
FIG. 7 is a schematic showing a conventional 2T/2C type ferroelectric memory.
Figure 8:
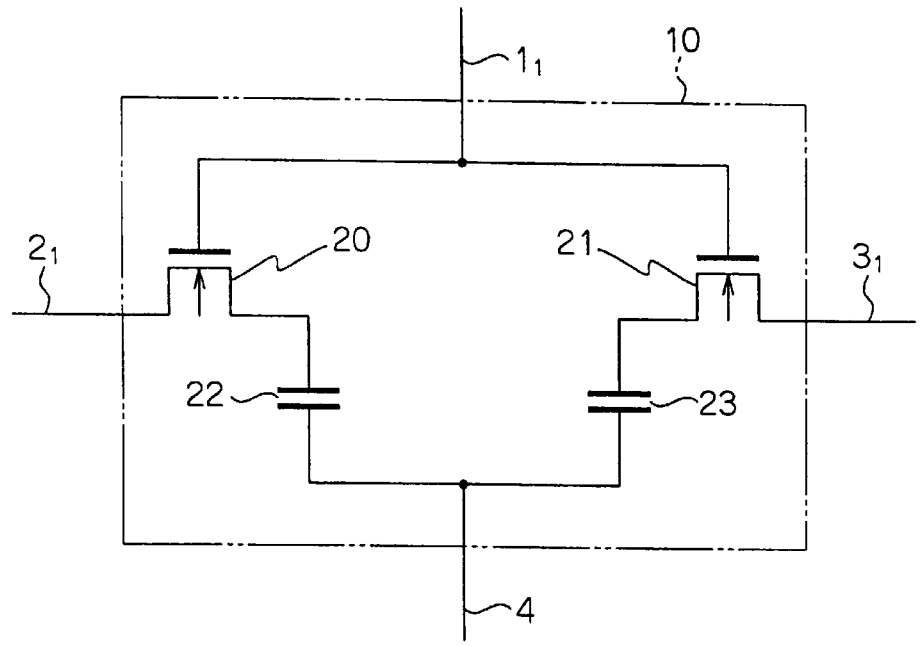
FIG. 8 is a schematic of a memory cell 10 in FIG. 7.
Figure 9:
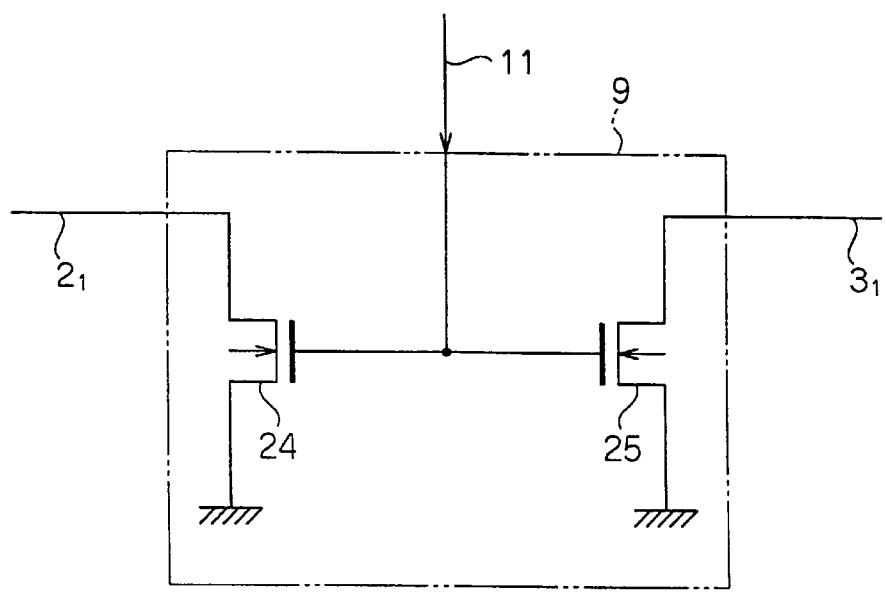
FIG. 9 is a schematic of a pre-charge circuit 9 in FIG. 7.

FIG. 1 is a block diagram showing the composition of the ferroelectric memory of the first embodiment of the present invention. This figure shows compositional element symbols and numbers identical to those shown in FIG. 7.

The ferroelectric memory of this embodiment comprises memory cells 50 which store toggle bits for the purpose of judging whether data stored in a corresponding word is data logically identical to data that was written or data that was reversed. The composition of the memory cells 50 is identical to the composition of the memory cells 10. Further, the memory cells 50 are disposed for every word that is a unit of data when a write/read is carried out by means of the data amps $13_1$, $13_2$, ... and the write buffers $14_1$, $14_2$, ...

Even further, in the example shown in FIG. 1, the ferroelectric memory comprises a switching circuit 18 disposed between the memory cell 10 and the sense amp 8, pre-charge circuits 9 disposed in front of and behind the switching circuit 18, and EXCLUSIVE OR circuits $15_1$, $15_2$.

Moreover, a data amp (DA)$13_t$ and a write buffer (WB) $14t$ are connected to a bit line pair $(2_t, 3_t)$ of the memory cell 50 for storing toggle bits through the Y-switching circuit 7 and the data line pair $16_t$ in like manner to the other bit line pair.

Hereafter, the bit line pair that corresponds to the "$i_{th}$" bit of the word is shown as positive bit line $2_i$ and negative bit line $3_i$, and the bit line pair that corresponds to the toggle bit is shown as positive bit line $2_t$ and negative bit line $3_t$. In addition, the gates of the two transistors are connected to one word line.

Figure 2:
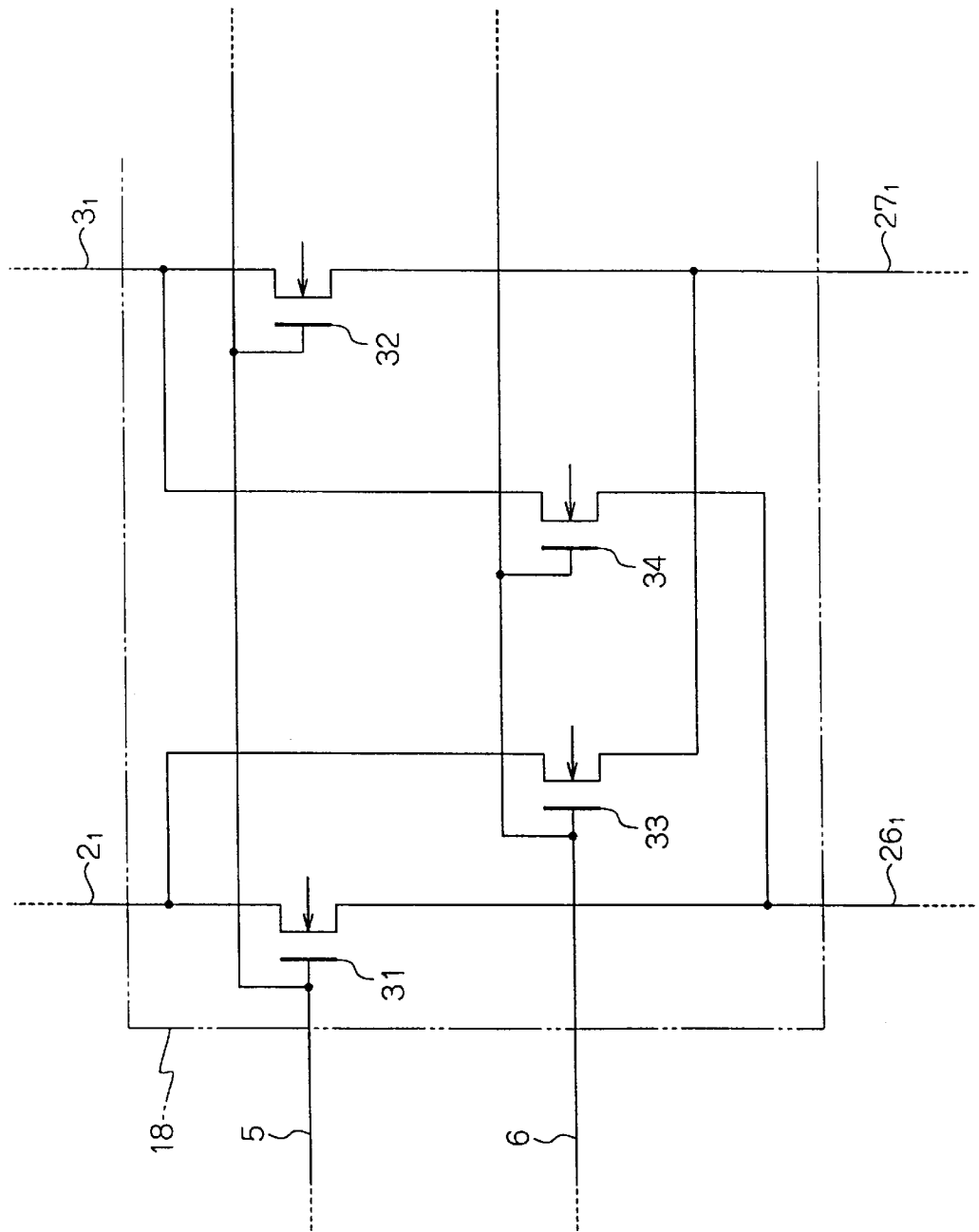
FIG. 2 is a schematic of a switching circuit 18 in FIG. 1.

Referring to FIG. 2, the switching circuit 18 comprises four N-channel transistors 31, 32, 33 and 34. For each line pair, so that the N-channel MOS transistors 31, 32 wherein the gates are connected to a direct connection signal 5 and the N-channel MOS transistors 33, 34 gates are connected to a cross connection signal 6.

In the switching circuit 18, when the direct connection signal 5 becomes active, the N-channel MOS transistors 31, 32 turn ON. When these transistors 31, 32 turn ON, the positive bit line and the complementary terminals are directly connected. In other words, the positive bit line $2_1$ and the complementary terminal $26_1$ connect and the negative bit line $3_1$ and the complementary terminal $27_1$ connect.

Further, in the switching circuit 18, when the cross connection signal 6 becomes active, the N-channel MOS transistors 33, 34 turn ON. When these transistors 33, 34 turn ON, the positive bit line and the complementary terminals are cross connected. In other words, the positive bit line $2_1$ and the complementary terminal $27_1$ connect and the negative bit line $3_1$ and the complementary terminal $26_1$ connect.

Because the signal close to VCC connects on both directions in the switching circuit 18 of this embodiment, it is necessary to set the active levels of the direct connection signal 5 and the cross connection signal 6 higher than VCC by only the threshold voltage portion of the MOS transistors. However, in the example shown in FIG. 2, because a composition using only four MOS transistors per one sense amp is possible, the effect is to reduce the number of circuits.

The EXCLUSIVE OR circuits $15_1$, $15_2$, ... execute an EXCLUSIVE OR operation between the output of each data amp $13_1$, $13_2$, and the output of the data amp $13_t$. The result of that operation outputs as final output data $28_1$, $28_2$, ... By means of this operation, the original data stored in the memory cell that was reversed or was not reversed outputs externally.

Moreover, the output of the write buffer $14_t$ that corresponds to the toggle bit is fixed at "0".

Figure 3:
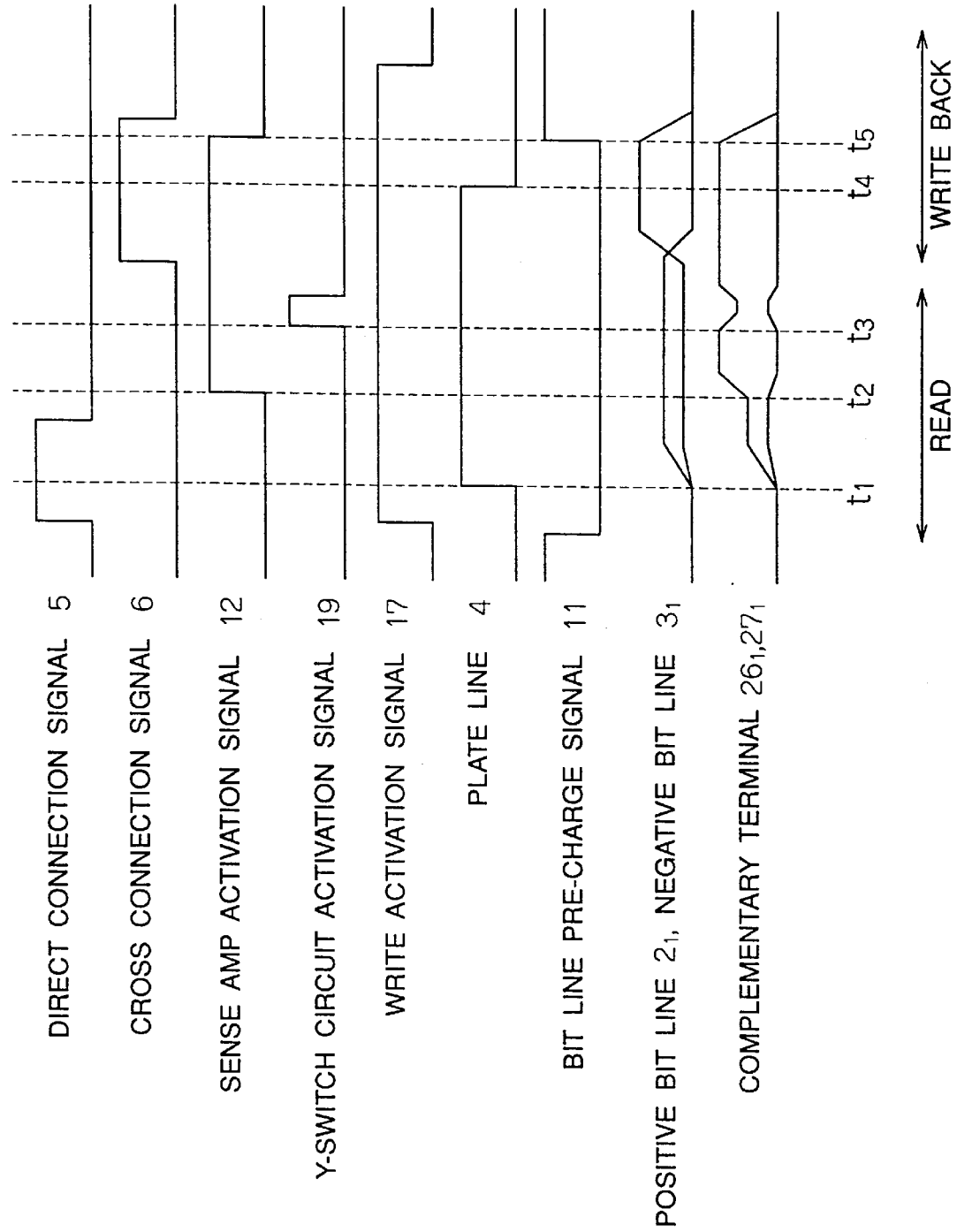
FIG. 3 is a timing chart that shows operations during read and write back at the star symbol in FIG. 1.

Next, the read operation of the ferroelectric memory of this embodiment will be described using the timing chart of FIG. 3.

Hereafter, in order to simplify the description, the memory cell 10 disposed at the intersection between the word line $1_1$ and the bit line pair that comprises and the positive bit line $2_1$ and the negative bit line $3_1$ will be described.

At first, the bit line pre-charge signal 11 falls from VCC to 0V then the positive bit line $2_1$ and the negative bit line $3_1$ float at 0V. Next, the direct connection signal 5 becomes active and the word line $1_1$ is VCC. Furthermore, when the plate line 4 rises from 0V to VCC, a voltage is applied to the ferroelectric capacitors 22, 23 of all the memory cells 10 selected on the word line $1_1$.

This voltage reverses the polarization of one of the ferroelectric capacitors and a large amount of charge is supplied from the ferroelectric capacitors. Then, the voltage of the complementary terminals of the sense amps 8 connected to the bit lines and to this becomes larger. At this time, because the other ferroelectric capacitor does not reverse its polarization, the complementary terminals of the sense amps 8 connected to the bit lines and to this becomes lower in comparison to the above high voltage (time t1). Hereupon, the complementary terminal $26_1$ (complementary terminal $27_1$) exhibits a higher voltage compared to the complementary terminal $27_1$ (complementary terminal $26_1$).

In this way, the difference in the voltage of the complementary terminals $26_1$, $27_1$ of the sense amps 8 is amplified with the sense amp activation signal 12 in an active state after the sense amps 8 separate from the bit line pair with the direction connection signal 5 in an inactive state (time t2). By means of this action, the complementary terminal $26_1$ (complementary terminal $27_1$) that exhibits a high voltage is VCC and the complementary terminal $27_1$ (complementary terminal $28_1$) that exhibits a low voltage is 0V. Thereafter, the bit line pair (positive bit line $2_1$, negative bit line $3_1$) connects to the data line pair $16_1$ through the Y-switch circuit 7 at a timing wherein the Y-switch circuit activation signal 19 is active (time t3) Finally, the signal that appears on the data line pair $16_1$ is amplified by the data amp $13_1$.

After the data is read, a write back is carried out such that the direction of the remnant polarization reverses before the read. Initially, with the cross connection signal 6 in an active state, the bit line pair and the complementary terminals $26_1$, $27_1$ of the sense amps 8 cross connect. With the sense amps 8 remaining in an active state, the plate line 4 falls from VCC to 0V (time t4) and then the sense amp activation signal 12 and the cross connection signal 6 become inactive with the bit line pre-charge signal 11 rising from 0V to VCC and the bit line pair becoming 0V (time t5). Finally, with the word line 11 at 0V, the ferroelectric capacitors 22, 23 separate from each of the positive bit lines $2_1$, $3_1$.

Figure 10:
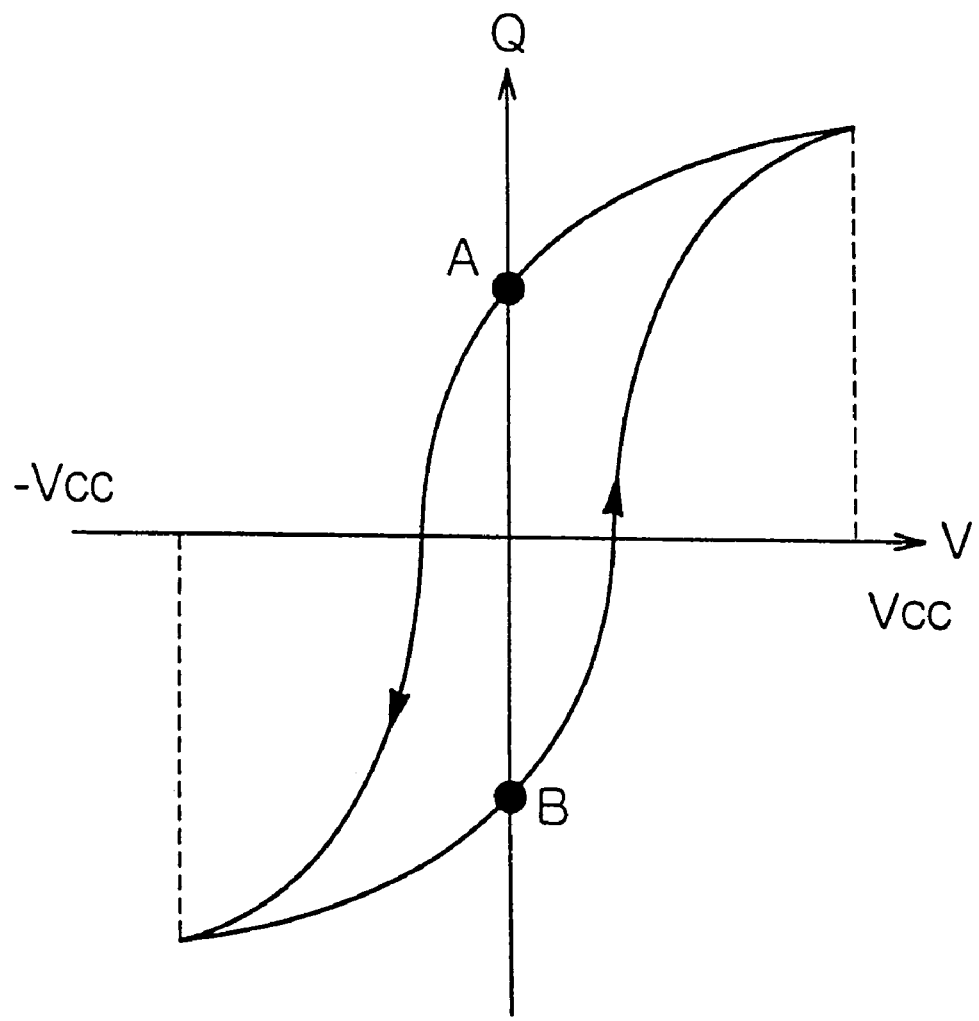
FIG. 10 shows the polarization characteristics of the ferroelectric capacitor.

Before the ferroelectric capacitor that reversed its polarization during the read lowers the voltage of the plate line 4, 0V is applied to the bit line side and VCC is applied to the plate line 4 side. When this ferroelectric capacitor lowers the plate line to 0V, both sides become 0V and, as shown in FIG. 10, the remnant polarization is maintained at point B in the Q-V plane. In contrast, when the ferroelectric capacitor that did not reverse its polarization during the read lowers the voltage of the plate line, VCC is applied to the bit line side and 0V is applied to the plate line side. When this ferroelectric capacitor lowers the bit line to 0V, both sides become 0V and as shown in FIG. 10, the remnant polarization is maintained at point A in the Q-V plane.

In this way, the nonvolatile semiconductor memory device of this embodiment reverses the polarization direction of the ferroelectric capacitor (object of the read) only one time through the read and write back.

Next, the write operation of the ferroelectric memory of this embodiment will be described.

Hereupon, in order to simplify the description, writing the input data $29_1$ to the memory cell 10 disposed at the intersection between the word line $1_1$ and the bit line pair that comprises and the positive bit line $2_1$ and the negative bit line $3_1$ will be described.

Because ferroelectric memory is a destructive read type memory, the storage data of the memory cell 10 that shares the desired word and word line must be protected. Therefore, using the direct connection signal 5 in a procedure identical to the previously described read operation, the storage data of the memory cell 10 on the word line is amplified and latched by the sense amps 8. Next, the Y-switch circuit 7 is made active in a state wherein the input data $29_1$ is guided to the data line pair $16_1$ by means of the write buffer $14_1$.

If data W that appears on the data line pair that corresponds to the bits comprising the word and the pair of data t that appears on the data line that corresponds to the toggle bit come into being as (W, t), at that moment the input data $29_1$ on the data line pair $16_1$, $16_t$ and the initial value (D, 0) of the toggle bit will appear. By means of selectively connecting the sense amps 8 connected to the memory cells 10 where data will be written to the data line pair $16_1$ utilizing the Y-switch circuit 7, the input data $19_1$ latches to the sense amp 8 that corresponds to the word that is the write object without disturbing the data of the other sense amps 8. Thereafter, the plate line 4 falls, a pre-charge of the bit line pair $2_1$, $3_1$ to 0V occurs, and the word line $1_1$ falls using the cross connection signal 6 in a procedure identical to the previously described write back.

Whenever a read access for a word on a certain word line occurs, the direction of the remnant polarization of all the ferroelectric capacitors on that word line reverses. Further, in a write access as well.

Therefore, the word that initially wrote the data D appears as (D, 0) or (D',1) on the data line during a read. Hereupon, D' represents a reversed D bit. Because of this, by means of executing an EXCLUSIVE OR operation between the output of the data amp $13_1$ that corresponds to the bits which comprise the word and the output of the data amp $13_t$ of the toggle bit and outputting the data, the output data $28_1$ always is D.

By means of the operation described above, during a read that corresponds to a certain word and during an access to another word that shares the word line, either of the two ferroelectric capacitors which store the data of that word reverse their polarization one time only in the 2T/2C type ferroelectric memory of the present invention.

Figure 4:
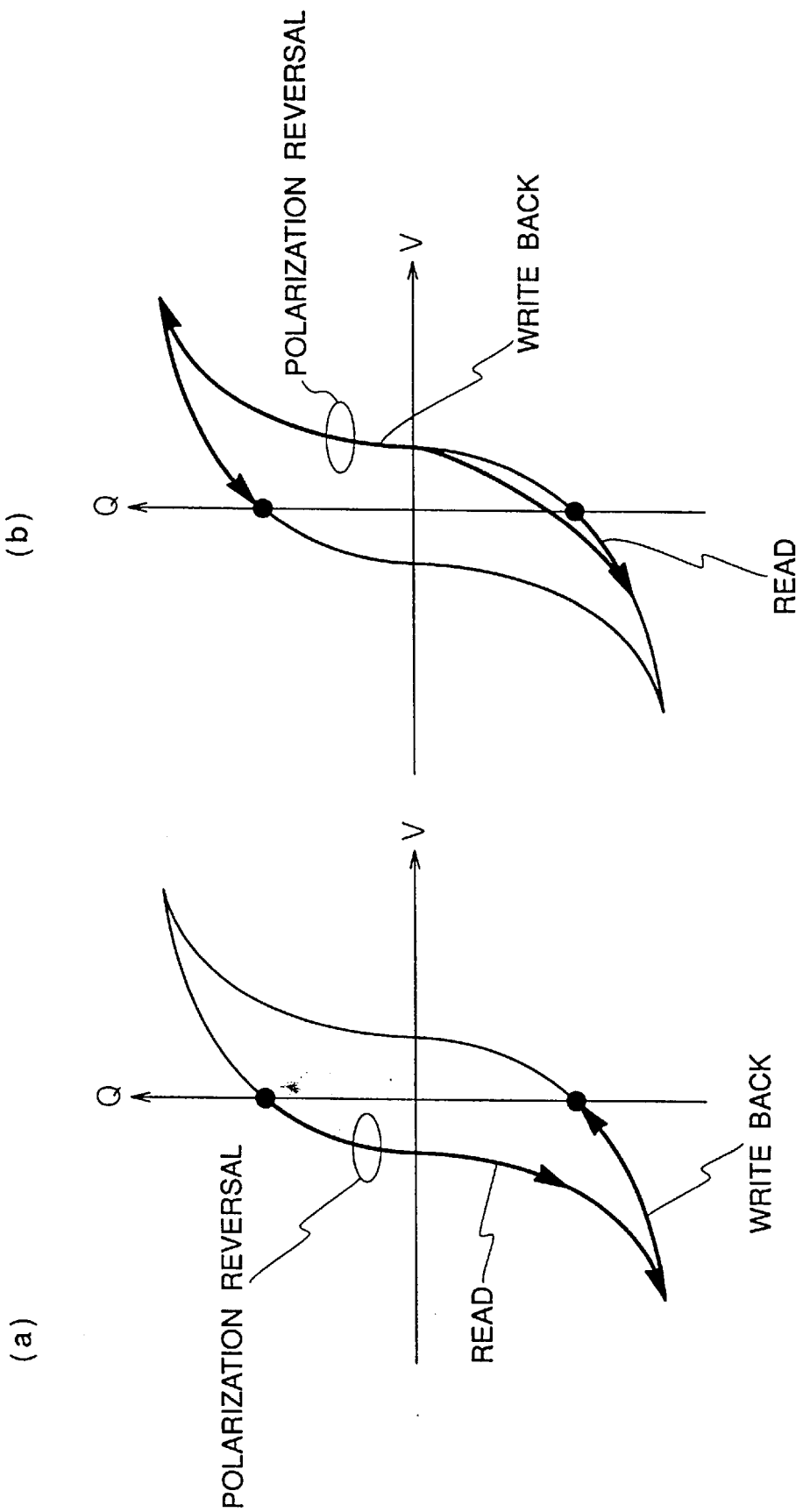
FIG. 4 (a) shows a plot the ferroelectric capacitor follows in the Q-V plane when polarization reversal occurs during a read and FIG. 4 (b) shows a plot the ferroelectric capacitor follows in the Q-V plane when polarization reversal does not occur during a read from among the two ferroelectric capacitors which comprise the memory cell 10 in FIG. 1.

FIG. 4 shows the plot the ferroelectric capacitor described above follows during a read/write back.

From among the two ferroelectric capacitors which comprise the memory cell, the ferroelectric capacitor that reversed its polarization during a read does not reverse polarization during a write back (FIG. 4 (a)) and in contrast, the ferroelectric capacitor that did not reverse its polarization during a read reverses its polarization during a write back (FIG. 4 (b)).

In the 2T/2C type ferroelectric memory that is the nonvolatile semiconductor memory device of this embodiment, during a read, both of the two ferroelectric capacitors which comprise the memory cell reverse their polarization one time each. Therefore, compared to a conventional 2T/2C type ferroelectric memory wherein one of the two ferroelectric capacitors reverses its polarization two times and the other ferroelectric capacitor does not reverse its polarization, for a case when repeatedly reading the same data, this repetition relieves fatigue of the ferroelectric capacitors and extends the lifespan twice as long.

Because ferroelectric memory is a destructive read type memory, the read operation for a certain word of course occurs when outputting data of that word to an external ferroelectric memory and also occurs during a read operation and a write operation for another word that shares that word and the word line. Even further, in the usage method of a normal semiconductor memory, it is considered that data written once and then repeatedly read occurs frequently. Due to these factors, writes are extremely infrequent compared to reads. Because of this, the nonvolatile semiconductor memory device of this embodiment that relieves fatigue while repeating a read operation is very effective in improving the extension of lifespan as well as the reliability.

Moreover, in the ferroelectric memory of this embodiment, overhead occurs in the circuit scale and operation speed compared to a conventional ferroelectric memory. However, the benefit of an extended lifespan is thought to be greater by far.

(Second Embodiment)

Figure 5:
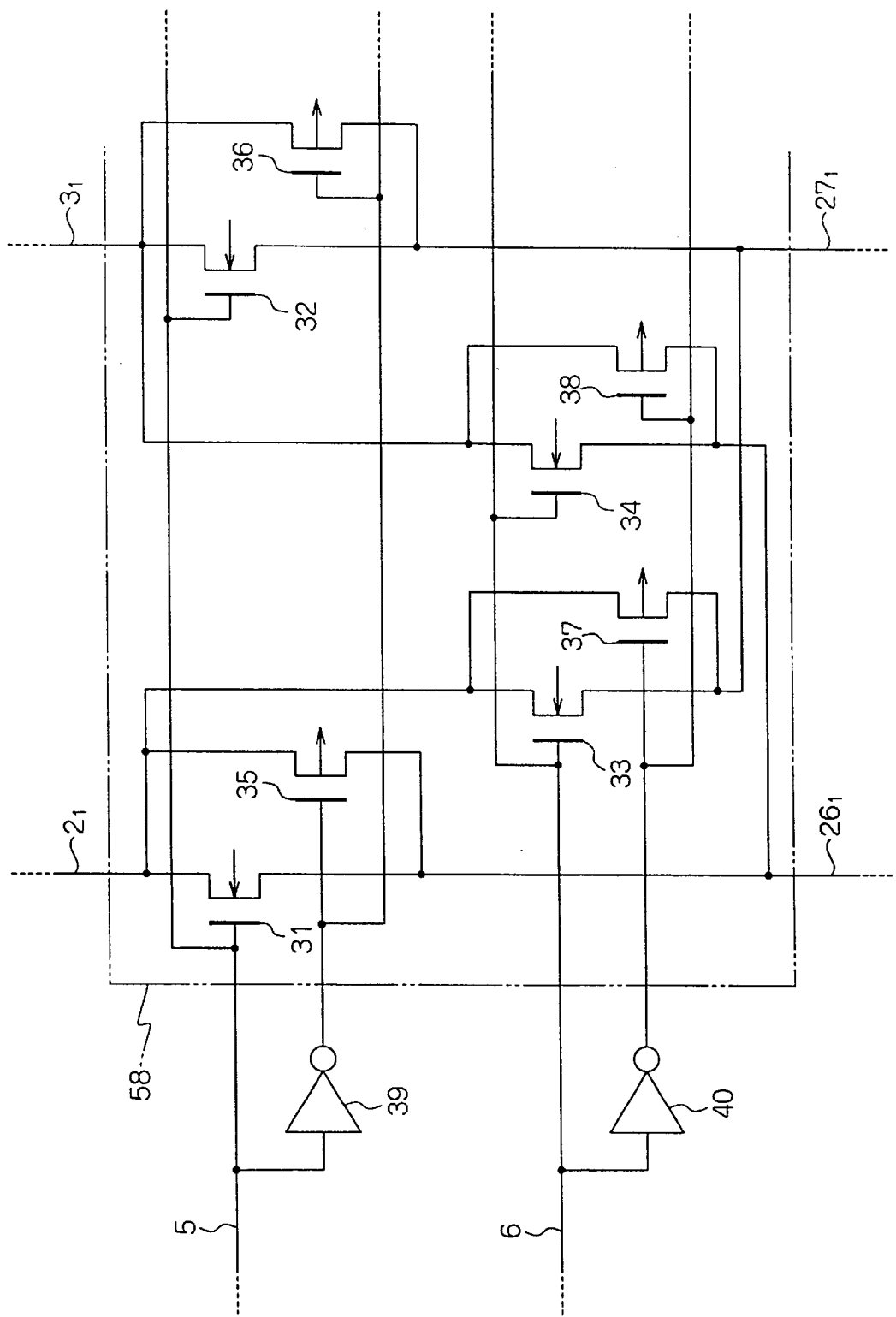
FIG. 5 is a schematic of a switching circuit 58 of the nonvolatile semiconductor memory device of the second embodiment of the present invention.

FIG. 5 is a schematic showing a switching circuit in the ferroelectric memory of the second embodiment of the present invention. In the example shown in FIG. 5, during a read, a positive bit line and a first complementary terminal, and a negative bit line and a second complementary terminal directly connect using a transfer gate that comprises first and fifth MOS transistors, and second and sixth MOS transistors. Further, during a write, a positive bit line and a second complementary terminal, and a negative bit line and a first complementary terminal cross connect using a transfer gate that comprises third and seventh MOS transistors, and fourth and eighth MOS transistors.

Therefore, with the active level of the direct connection signal and the cross connection signal left as is at VCC, a write and read voltage within a range from ground level to VCC level is sufficiently transferred.

For the nonvolatile semiconductor memory device of this embodiment, the switching circuit 18 in the nonvolatile semiconductor memory device of the first embodiment of FIG. 1 is replaced by the switching circuit 58.

Compared to the switching circuit 18 of FIG. 2, the switching circuit 58 of this embodiment is comprised by an inverter 39 that logically reverses the direct connection signal 5, P-channel MOS transistors 35, 36 wherein the gates are connected to the output of the inverter 39, an inverter 40 that logically reverses the cross connection signal 6, and P-channel transistors 37, 38 wherein the gates are connected to the output of the inverter 40.

This embodiment is comprised by transfer gates utilizing the N-channel MOS transistor 31 and the P-channel MOS transistor 35, the N-channel MOS transistor 32 and the P-channel MOS transistor 36, the N-channel MOS transistor 33 and the P-channel MOS transistor 37, and the N-channel MOS transistor 34 and the P-channel MOS transistor 38.

In the switching circuit 58, when the direct connection signal 5 becomes active, the N-channel MOS transistors 31, 32 turn ON and the output of the inverter 39 becomes inactive. By means of these actions, the P-channel MOS transistors 35, 36 turn ON and the positive bit line $2_1$ and the complementary terminal $26_1$ as well as the negative bit line $3_1$ and the complementary terminal $27_1$ connect.

Furthermore, in the switching circuit 58, when the cross connection signal 6 becomes active, the N-channel MOS transistors 33, 34 turn ON and the output of the inverter 40 becomes inactive. By means of these actions, the P-channel MOS transistors 37, 38 turn ON and the positive bit line $2_1$ and the complementary terminal $27_1$ as well as the negative bit line $3_1$ and the complementary terminal $26_1$ connect.

In the switching circuit 18 of the first embodiment described above, it is necessary to set the active levels of the direct connection signal 5 and the cross connection signal 6 higher than VCC by only the threshold voltage portion of the MOS transistors. However, in the switching circuit 58 of this embodiment, the active levels of the direct connection signal 5 and the cross connection signal 6 can be VCC and the number of transistors per one sense amp is eight which is more when compared to the first embodiment.

(Third Embodiment)

Figure 6:
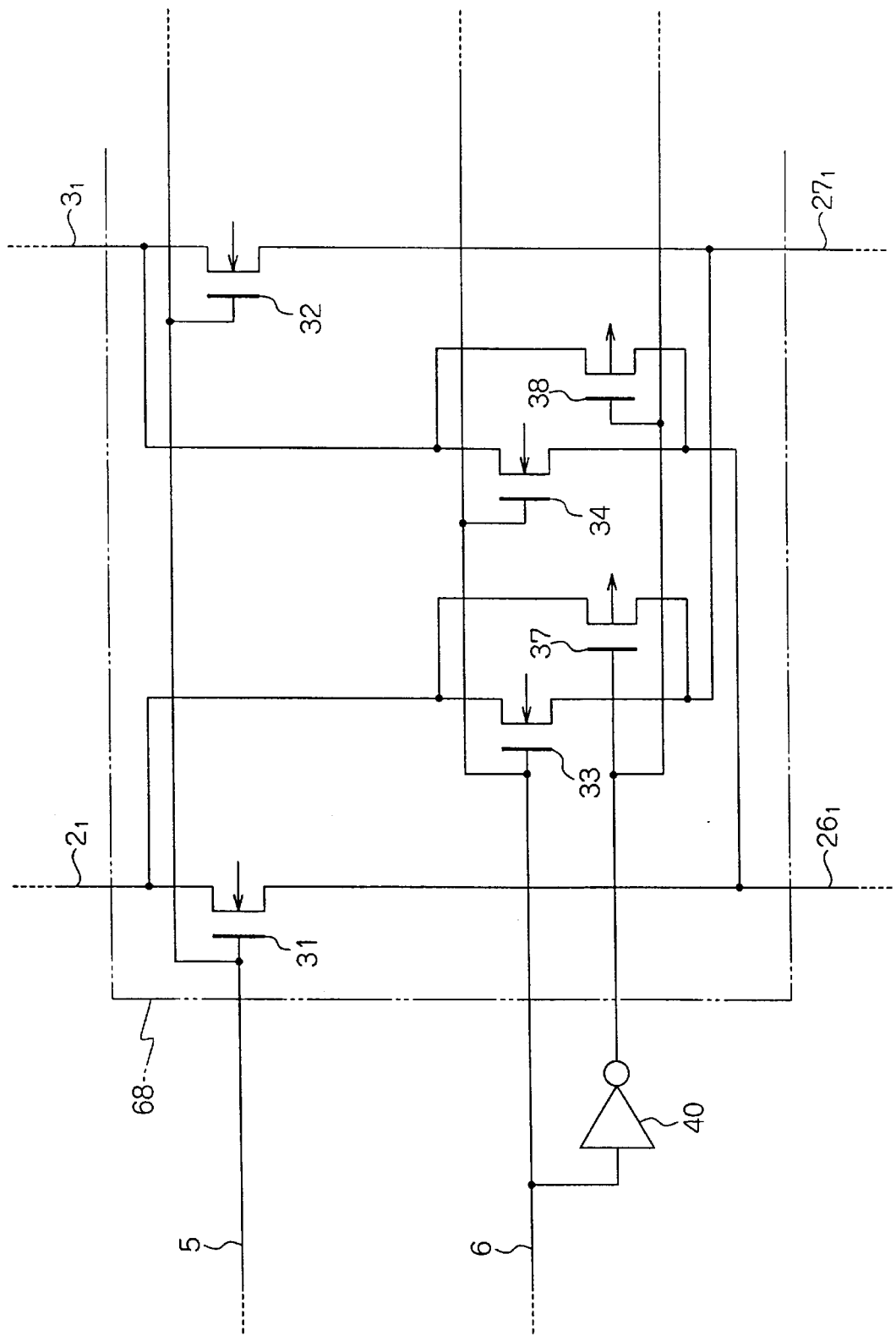
FIG. 6 is a schematic of a switching circuit 68 of the nonvolatile semiconductor memory device of the third embodiment of the present invention.

FIG. 6 is a schematic showing the composition of a switching circuit in the ferroelectric memory of the third embodiment of the present invention. In the example shown in FIG. 6, during a read, a positive bit line and a first complementary terminal, and a negative bit line and a second complementary terminal directly connect using a first and second MOS transistor and the threshold voltage, portion of the read bit line voltage lower than VCC, is sufficiently transferred. Further, during a write only, a positive bit line and a second complementary terminal, and a negative bit line and a first complementary terminal cross connect using a transfer gate that comprises third and fifth MOS transistors, and fourth and sixth MOS transistors. By means of this action, a write voltage within a range from ground level, amplified by the sense amp, to VCC level is sufficiently transferred to the bit line.

For the nonvolatile semiconductor memory device of this embodiment, the switching circuit 18 in the nonvolatile semiconductor memory device of the first embodiment of FIG. 1 is replaced by the switching circuit 68.

Compared to the switching circuit 18 of FIG. 2, the switching circuit 68 of this embodiment is comprised by an inverter 40 that logically reverses the cross connection signal 6, and P-channel transistors 37, 38 wherein the gates are connected to the output of the inverter 40.

This embodiment is comprised by transfer gates utilizing the N-channel MOS transistor 33and the P-channel MOS transistor 37, the N-channel MOS transistor 34 and the P-channel MOS transistor 38.

In the switching circuit 68, when the direct connection signal 5 becomes active, the N-channel MOS transistors 31, 32 turn ON and the positive bit line $2_1$ and the complementary terminal $26_1$ as well as the negative bit line $3_1$ and the complementary terminal $27_1$ connect.

Furthermore, in the switching circuit 68, when the cross connection signal 6 becomes active, the N-channel MOS transistors 33, 34 turn ON and the output of the inverter 40 becomes inactive. By means of these actions, the P-channel MOS transistors 37, 38 turn ON and the positive bit line $2_1$ and the complementary terminal $27_1$ as well as the negative bit line $3_1$ and the complementary terminal $26_1$ connect.

In the switching circuit 68 of this embodiment, the cross connection during a write is carried out in like manner to the switching circuit 58 of the above-mentioned second embodiment. Moreover, during a read, the sense amps 8 and the bit line pair connect by means of the two MOS transistors in like manner to the switching circuit 18 of the above-mentioned first embodiment.

In this embodiment, because the electric potential output to the bit line pair during a read is not amplified by the sense amps 8, only a voltage lower than VCC is output, becoming lower than VCC- (threshold voltage of MOS transistors). Because of this, a sufficient connection can be obtained in this embodiment using the N-channel MOS transistors during a read and during a write using only the transfer gates.

Furthermore, the write voltage at VCC level is transferred to the bit line utilizing the transfer gates during a cross connected write.

The invention may be embodied in other specific forms without departing from the spirit or essential characteristic thereof. The present embodiments is therefore to be considered in all respects as illustrative and not restrictive, the scope of the invention being indicated by the appended claims rather than by the foregoing description and all changes which come within the meaning and range of equivalency of the claims are therefore intended to be embraced therein.

The entire disclosure of Japanese Patent Application No. 9-166103 (Filed on Jun. 23, 1997) including specification, claims, drawings and summary are incorporated herein by reference in its entirety.

What is claimed is:

1. A nonvolatile ferroelectric memory device having a plurality of memory cells arranged in columns and rows, the memory cells comprising ferroelectric electrodes that maintain a polarization state of "0" or "1", the memory cells being connected to bit lines, the memory device comprising:

a switching circuit that reverses the sign of data read from a first memory cell when this data is written back to the first memory cell;

a toggle bit memory that stores a toggle bit that represents the state of the sign switched by the switching circuit; and a reswitching circuit that returns the reversed sign to its normal state utilizing the switching circuit, based on the data read from the memory cells and the toggle bit read from the toggle bit memory.

2. A nonvolatile ferroelectric memory device according to claim 1, wherein the toggle bit memory is a memory cell that is provided for a group of memory cells and stores the toggle bit of the group of memory cells.

3. A nonvolatile ferroelectric memory device according to claim 1, wherein the reswitching circuit comprises a logic circuit that outputs an EXCLUSIVE OR using the output of the first memory cell and the output of the toggle bit memory.

4. A nonvolatile ferroelectric memory device having a plurality of memory cells arranged in columns and rows, the memory cells comprising ferroelectric electrodes that maintain a polarization state of "0" or "1", the memory cells being connected to bit lines, the memory cell columns having a word line and a plate line connected to each memory cell along the columns, the memory cell rows having a pair of the bit lines, positive and negative, connected to each memory cell along the rows, the memory device comprising:

sense amps that amplify a voltage difference between the pair of bit lines when a first voltage is applied to the word line and a second voltage is applied to the plate line, the sense amps each having a complementary pair of terminals, wherein the sense amps are connected along the columns by the complementary pair of terminals;

a switching circuit disposed between the sense amps and the memory cells, the switching circuit using an input front stage of the sense amps to switch the positive and negative bit lines that connect the sense amps to the memory cells, the switching of bit lines effecting one of a normal correspondence and a reversal of a sign of data;

a toggle bit memory that stores a toggle bit that represents the state that is switched by the switching circuit; and a reswitching circuit that returns the reversed state to its normal state by utilizing the switching circuit based on data read from the memory cells and the toggle bit read from the toggle bit memory.

5. A nonvolatile ferroelectric memory device according to claim 4, wherein said switching circuit further comprises:

first and second transistors that receive a direct connection signal; and third and fourth transistors that receive a cross connection signal;

wherein, the first and second transistors connect the pair of bit lines to the respective one of the sense amps in positive/negative normal correspondence with the complementary terminals when the direct connection signal is active;

and wherein the third and fourth transistors connect the pair of bit lines to the respective one of the sense amps in reversed positive/negative correspondence with the complementary terminals when the cross connection signal is active.

6. A nonvolatile ferroelectric memory device according to claim 4, wherein said switching circuit further comprises:

first and second transistors that receive a direct connection signal;

third and fourth transistors that receive a cross connection signal;

fifth and sixth transistors that receive an inverted direct connection signal; and seventh and eighth transistors that receive an inverted cross connection signal;

and wherein the first, second, fifth and sixth transistors connect the bit lines and the sense amps in normal positive/negative correspondence when the direct connection signal is active;

and wherein the third and fourth transistors connect the bit lines and the sense amps in reversed positive/negative correspondence with the complementary terminals when the cross connection signal is active.

7. A nonvolatile ferroelectric memory device according to claim 4, wherein the switching circuit further comprises:

first and second transistors that receive a direct connection signal;

third and fourth transistors that receive a cross connection signal; and seventh and eighth transistors that receive an inverted cross connection signal;

and wherein the first and second transistors connect the bit lines and the sense amps in normal positive/negative correspondence when the direct connection signal is active;

and wherein the third, fourth, seventh and eighth transistors connect the bit lines and the sense amps in reversed positive/negative correspondence with the complementary terminals when the cross connection signal is active.

8. A nonvolatile ferroelectric memory device having a plurality of memory cells arranged in columns and rows, the memory cells comprising ferroelectric electrodes that maintain a polarization state of "0" or "1", the memory cells being connected to bit lines, the memory device comprising:

switching means that reverses the sign of the data when data read from the memory cells is written back to the memory cells;

toggle bit memory means that stores a toggle bit that represents the state of the sign that was switched by switching means; and a reswitching circuit that returns the reversed sign to its normal state utilizing the switching circuit based on the data read from the memory cells and the toggle bit read from the toggle bit memory.

9. A nonvolatile ferroelectric memory device having a plurality of memory cells arranged in columns and rows, the plurality of memory cells provided for words that are units of data, the memory device also having a plurality of data line pairs and a plurality of bit line pairs, the bit line pairs each comprising a positive bit line and a negative bit line, the memory cells disposed at the intersection between one of the bit line pairs, and a word line, the memory cells each comprising a first transistor having a gate connected to the word line, a second transistor having a gate connected to the word line, a first ferroelectric capacitor having one terminal connected to the word line through the first transistor and its other terminal connected to a plate line, a second ferroelectric capacitor having one terminal connected to the word line through the second transistor and its other terminal connected to the plate line, the memory device comprising:

a plurality of sense amps each having a first complementary terminal and a second complementary terminal each respective sense amp amplifying an electric potential difference between its first complementary terminal and its second complementary terminal;

a Y-switch circuit that selectively connects the bit line pairs and data line pairs;

a plurality of data amps that each output an electric potential difference between a respective one of the data line pairs as data;

a plurality of write buffers that transfer data from an external source to the data line pairs;

a switching circuit disposed between the sense amps and the bit line pairs, the switching circuit connecting each respective positive bit line to the first complementary terminal of each corresponding one of the sense amps as well as connecting each respective negative bit line to the second complementary terminal of the corresponding one of the sense amps when a direct connection signal becomes active during a read, the switching circuit also connecting each respective positive bit line to the second complementary terminal of each corresponding one of the sense amps as well as connecting each respective negative bit line to the first complementary terminal of the corresponding one of the sense amps when a cross connection signal becomes active during a write;

write/read means comprising the data amps, the write buffers, and groups of the memory cells for performing write/read of the words and for storing toggle bits which are "0" when data that is stored in a corresponding word is logically the same as data that was written or "1" when data that is stored in a corresponding word is reversed from data that was written; and a plurality of logical operation elements that execute an EXCLUSIVE OR operation using data that was output from the data amps and the toggle bits and output the operation results as output data.

10. A nonvolatile ferroelectric memory device according to claim 9, wherein the switching circuit comprises:

a plurality of first MOS transistors having the direct connection signal connected to each first MOS transistor's gate and which turn ON when the direct connection signal becomes active, thereby connecting each of the positive bit lines to the first complementary terminal of each of the sense amps;

a plurality of second MOS transistors having the direct connection signal connected to each second MOS transistor's gate and which turn ON when the direct connection signal becomes active, thereby connecting each of the negative bit lines to the second complementary terminal of each of the sense amps;

a plurality of third MOS transistors having the cross connection signal connected to each third MOS transistor's gate and which turn ON when the cross connection signal becomes active, the connecting each of the positive bit lines to the second complementary terminal of each of the sense amps; and a plurality of fourth MOS transistors having the cross connection signal connected to each fourth MOS transistor's gate and which turn ON when the cross connection signal becomes active, thereby connecting each of the negative bit lines to the first complementary terminal of each of sense amps.

11. A nonvolatile ferroelectric memory device according to claim 9, wherein the switching circuit comprises:

a plurality of first MOS transistors having the direct connection signal connected to each first MOS transistor's gate and which turn ON when the direct connection signal becomes active, thereby connecting each of the positive bit lines and the first complementary terminal of each of sense amps;

a plurality of second MOS transistors having the direct connection signal connected to each second MOS transistor's gate and which turn ON when the direct connection signal becomes active connecting each of the negative bit lines and the second complementary terminal of each of the sense amps;

a plurality of third MOS transistors having the cross connection signal connected to each third MOS transistor's gate and which turn ON when the cross connection signal becomes active, thereby connecting each of the positive bit lines and the second complementary terminal of each of the sense amps;

a plurality of fourth MOS transistors having the cross connection signal connected to each fourth MOS transistor's gate and which turn ON when the cross connection signal becomes active, thereby connecting each of the negative bit lines and the first complementary terminal of each of the sense amps;

a first inverter that inverts the logic of the direct connection signal, the first inverter having an output;

a second inverter that inverts the logic of the cross connection signal, the second inverter having an output;

a plurality of fifth MOS transistors having the output of the first inverter connected to each fifth MOS transistor's gate and which turn ON when the output of the first inverter becomes inactive thereby connecting each of the positive bit lines and the first complementary terminal of each of the sense amps;

a plurality of sixth MOS transistors having the output of the first inverter connected to each sixth MOS transistor's gate and which turn ON when the output of the first inverter becomes inactive, thereby connecting each of the negative bit lines and the second complementary terminal of each of the sense amps;

a plurality of seventh MOS transistors having the output of the second inverter connected to each seventh MOS transistor's gate and which turn ON when the output of the second inverter becomes inactive connecting each of the positive bit lines and the second complementary terminal of each of the sense amps; and a plurality of eighth MOS transistors having the output of the second inverter connected to each eighth MOS transistor's gate and which turn ON when the output of the second inverter becomes inactive connecting each of the negative bit lines and the first complementary terminal of each of the sense amps.

12. A nonvolatile ferroelectric memory device as set forth in claim 9, wherein the switching circuit comprises:

a plurality of first MOS transistors having the direct connection signal connected to each first MOS transistor's gate and which turn ON when the direct connection signal becomes active, thereby connecting each of the positive bit lines and the first complementary terminal of each of sense amps;

a plurality of second MOS transistors having the direct connection signal connected to each second MOS transistor's gate and which turn ON when the direct connection signal becomes active, thereby connecting each of the negative bit lines and the second complementary terminal of each of the sense amps;

a plurality of third MOS transistors having cross connection signal connected to each third MOS transistor's gate and which turn ON when the cross connection signal becomes active, thereby connecting each of the positive bit lines and the second complementary terminal of each of the sense amps;

a plurality of fourth MOS transistors having the cross connection signal connected to each fourth MOS transistor's gate and which turn ON when the cross connection signal becomes active, thereby connecting each of the negative bit lines and the first complementary terminal of each of the sense amps;

an inverter that inverts the logic of the cross connection signal;

a plurality of fifth MOS transistors having the output of the inverter connected to each fifth MOS transistor's gate and which turn ON when the output of the inverter becomes inactive, thereby connecting each of the positive bit lines and the second complementary terminal of each of the sense amps;

a plurality of sixth MOS transistors having the output of the inverter connected to each sixth MOS transistor's gate and which turn ON when the output of the inverter becomes inactive, thereby connecting each of the negative bit lines and the first complementary terminal of each of the sense amps.

* * * * *